United States Patent
Walker

(10) Patent No.: US 7,339,821 B2
(45) Date of Patent: Mar. 4, 2008

(54) DUAL-GATE NONVOLATILE MEMORY AND METHOD OF PROGRAM INHIBITION

(75) Inventor: Andrew J. Walker, Mountain View, CA (US)

(73) Assignee: Schiltron Corporation, Mountain View, CA (US)

(*) Notice: Subject to any disclaimer, the term of this patent is extended or adjusted under 35 U.S.C. 154(b) by 114 days.

(21) Appl. No.: 11/304,231

(22) Filed: Dec. 14, 2005

(65) Prior Publication Data

US 2007/0133286 A1    Jun. 14, 2007

(51) Int. Cl.
G11C 11/34 (2006.01)
G11C 16/04 (2006.01)

(52) U.S. Cl. .................. 365/185.02; 365/185.17; 365/185.19

(58) Field of Classification Search ........... 365/185.01, 365/185.02, 185.17, 185.18, 185.19, 183.26
See application file for complete search history.

(56) References Cited

U.S. PATENT DOCUMENTS

| | | | |
|---|---|---|---|
| 5,677,873 A | 10/1997 | Choi et al. | |
| 5,715,194 A | 2/1998 | Hu | |
| 6,011,287 A | 1/2000 | Itoh et al. | |
| 6,054,734 A | 4/2000 | Aozasa et al. | |
| 6,061,270 A | 5/2000 | Choi | |
| 6,107,658 A | 8/2000 | Itoh et al. | |
| 7,061,042 B2 * | 6/2006 | Lee et al. | 257/315 |

OTHER PUBLICATIONS

K. Suh et al. "A 3.3 V 32 Mb NAND Flash Memory with Incremental Step Pulse Programming Scheme" IEEE journal of Solid-State Circuits, vol. 30, No. 11, Nov. 1995, pp. 1149-1156.

T. Jung et al. "A 117-mm$^2$ 3.3-V Only 128-Mb Multilevel NAND Flash Memory for Mass Storage Applications" IEEE Journal of Solid-State Circuits, vol. 31, No. 11, Nov. 1996, pp. 1575-1583.

* cited by examiner

Primary Examiner—VanThu Nguyen
(74) Attorney, Agent, or Firm—Edward C. Kwok; MacPherson Kwok Chen & Heid LLP

(57) ABSTRACT

A memory circuit and a method is provided for programming a dual-gate memory cell without program disturb in other dual-gate memory cells in the memory circuit coupled by common word lines. In one embodiment, the method uses a self-boosting technique on unselected memory cells having source and drain regions in the shared semiconductor layer between their memory devices and their access devices brought to a predetermined voltage close to the threshold voltage of their access devices, thereby rendering the source and drain regions substantially floating. In some embodiments, the source and drain regions are brought to the predetermined voltage via one or more select gates and intervening access gates. In some embodiments, the select gates are overdriven.

22 Claims, 11 Drawing Sheets

DUAL-GATE NONVOLATILE MEMORY AND METHOD OF PROGRAM INHIBITION

BACKGROUND OF THE INVENTION

1. Field of the Invention

The present invention relates to non-volatile memory devices. In particular, the present invention relates to the design and the programming of dual-gate flash memory devices.

2. Discussion of the Related Art

In a NAND-type flash memory device, where memory cells in different NAND strings share a common word line, inadvertent programming of unselected memory cells ("program disturb") must be prevented. Two techniques for preventing such inadvertent programming are self-boosting (SB) and local self-boosting (LSB). Both approaches rely on capacitive coupling to boost the potential in the inversion channel in the unselected memory cell.

The self-boosting technique is described, for example, in (1) "A 3.3 V 32 Mb NAND flash Memory with Incremental Step Pulse Programming Scheme", by Suh et al., IEEE J. Solid-State Circuits, vol. 30, pp. 1149-1156, November 1995, and (2) U.S. Pat. No. 5,677,873, entitled "Methods of Programming Flash EEPROM Integrated Circuit Memory Devices to Prevent Inadvertent Programming of Nondesignated NAND Memory Cells Therein", to Choi et al., filed on Sep. 19, 1996 and issued on Oct. 14, 1997.

The local self-boosting technique is described, for example, in (1) "A 117-mm2 3.3-V Only 128-Mb Multilevel NAND Flash Memory for Mass Storage Applications", by Jung et al., IEEE J. Solid-State Circuits, vol. 31, pp. 1575-1583, November 1996, (2) U.S. Pat. No. 5,715,194, entitled "Bias Scheme of Program Inhibit for Random Programming in a NAND Flash Memory", to Hu, filed on Jul. 24, 1996 and issued on Feb. 3, 1998, (3) U.S. Pat. No. 6,011,287, entitled "Non-Volatile Semiconductor Memory Device", to Itoh et al., filed on Feb. 27, 1998 and issued on Jan. 4, 2000, (4) U.S. Pat. No. 6,061,270, entitled "Method for Programming a Non-Volatile Memory Device with Program Disturb Control", to Choi, filed on Dec. 28, 1998 and issued on May 9, 2000, and (5) U.S. Pat. No. 6,107,658, entitled "Non-Volatile Semiconductor Memory Device", to Itoh et al., filed on Dec. 22, 1999 and issued on Aug. 22, 2000.

The methods described in the references mentioned above relate to preventing program disturb in NAND flash memories consisting of floating gate transistors whose inversion channels are located in the bulk of a silicon wafer and whose channel conductivity is controlled by a single control gate at each memory cell.

A NAND flash memory cell with a dual-gate structure is disclosed in U.S. Pat. No. 6,054,734, entitled "Non-Volatile Memory Cell Having Dual Gate Electrodes," to Aozasa, filed on Nov. 5, 1997 and issued on Apr. 25, 2000. A dual-gate memory cell includes an access device and a storage device, which are located on opposite sides of, and share, an active silicon layer. Aozasa explains that the dual-gate approach reduces read disturb (i.e., program disturb resulting from a read operation) by having close electrical interaction between the devices within a dual-gate structure. In other words, the charge stored in one device in the dual-gate device would affect the threshold voltage of the other device.

SUMMARY

The present invention provides a non-volatile dual-gate memory device, such as a dual-gate NAND flash memory device, which has high immunity to program disturb.

According to one embodiment of the present invention, a method programs a dual-gate memory cell without program disturb in unselected dual-gate memory cells which are coupled to the dual-gate memory cell to be programmed by common word lines. In one embodiment, the method uses a self-boosting technique on unselected memory cells by first bringing the source and drain regions in the shared semiconductor layer between their memory devices and their access devices to a predetermined voltage close to the threshold voltage of their access devices, thereby rendering the source and drain regions substantially floating. A higher voltage is then applied to the gate terminals of the access devices to boost the voltages at the source and drain regions of the unselected dual-gate memory cells to a higher voltage, such that the voltage between a gate electrode of an unselected memory device, which is at the programming voltage, and the source and drain regions, which are at the boosted voltage, is insufficient to program the unselected memory device.

The source and drain regions may be brought to the initial (i.e., pre-boost) voltage from either a bit line or a common source line.

In some embodiments of the present invention, the source and drain regions are brought to the predetermined voltage via one or more select gates and intervening access gates. In some embodiments, all access devices in the serially connected string of dual-gate memory cells are rendered conducting during the self-boosting.

In some embodiments of the present invention, the select gates are overdriven.

The method of the present invention takes advantage of a strong electrical interaction between the access devices and the storage devices in the dual-gate NAND string under certain biasing conditions. The present invention is especially applicable where the charge stored in the memory device of a dual-gate memory cell does not affect the threshold voltage of the access device of the same dual-gate memory cell.

The present invention is better understood upon consideration of the detailed description below and the accompanying drawings.

DETAILED DESCRIPTION OF THE PREFERRED EMBODIMENTS

The present invention is illustrated by the embodiment described herein, with reference to the accompanying drawings.

Figure 1:
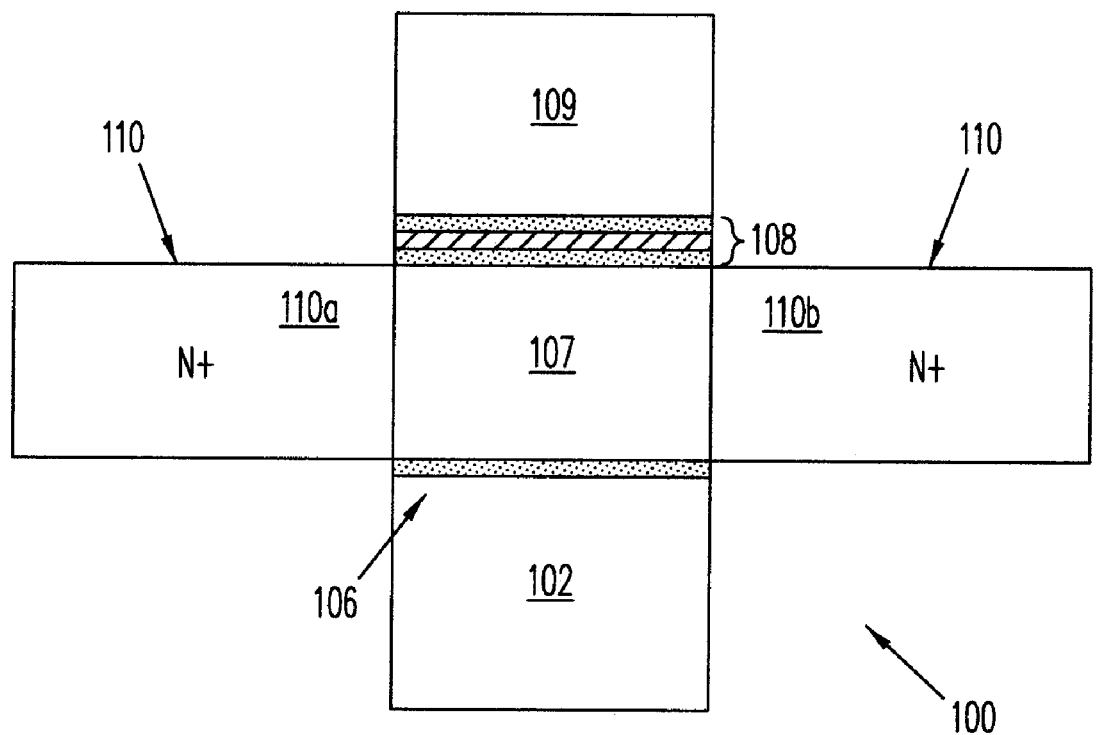
FIG. 1 shows a cross section of a dual-gate memory cell 100, including a memory device and a non-memory device.

FIG. 1 shows a structural schematic representation of a dual-gate memory cell 100 implemented using an NMOS fabrication process. As shown in FIG. 1, dual-gate memory cell 100 includes semiconductor layer 110, which is shared between a storage device and an access device. Semiconductor layer 110 includes common channel region 107, provided between heavily doped N+ source/drain regions 110a and 110b. Dielectric layers 106 and 108 isolates common channel region 107 from gate electrodes 102 and 109, respectively. Dielectric layer 108 includes a charge storage structure embedded in a gate dielectric material. This charge storage structure may be either a floating gate conductor or a charge trapping dielectric. Thus, the access device is formed by gate electrode 102, dielectric layer 106, common channel region 107 and source/drain regions 110a and 110b. The storage device is formed by gate electrode 109, dielectric layer 108, common channel region 107 and source/drain regions 110a and 110b. A charge may be stored in the charge storage structure within dielectric layer 108. A number of dual-gate memory cells may be serially connected to form a NAND string.

Figure 2:
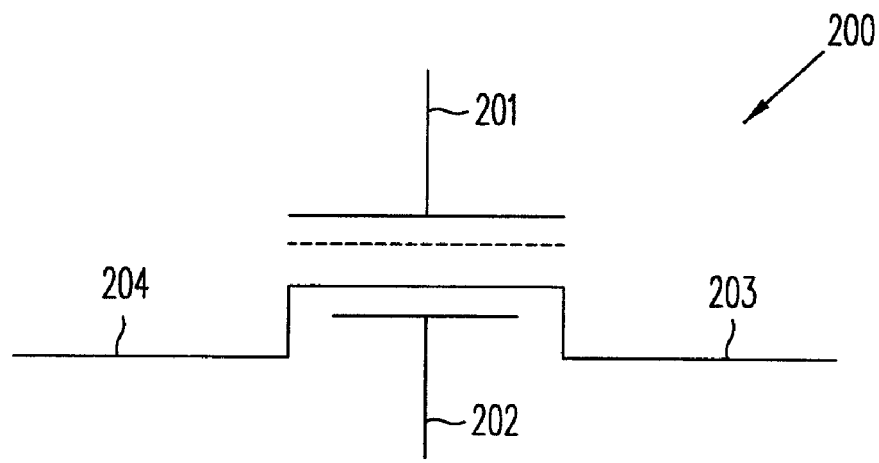
FIG. 2 is a schematic representation of a dual-gate memory cell.

FIG. 2 shows schematic symbol 200 for representing a dual-gate memory cell, such as dual-gate memory cell 100 of FIG. 1, in an electrical circuit. As shown in FIG. 2, symbol 200 includes terminals 203 and 204, representing the connections to source/drain regions 110a and 110b, and terminals 201 and 202, representing the connections to gate electrodes 109 and 102 of the storage and access devices, respectively.

Figure 3:
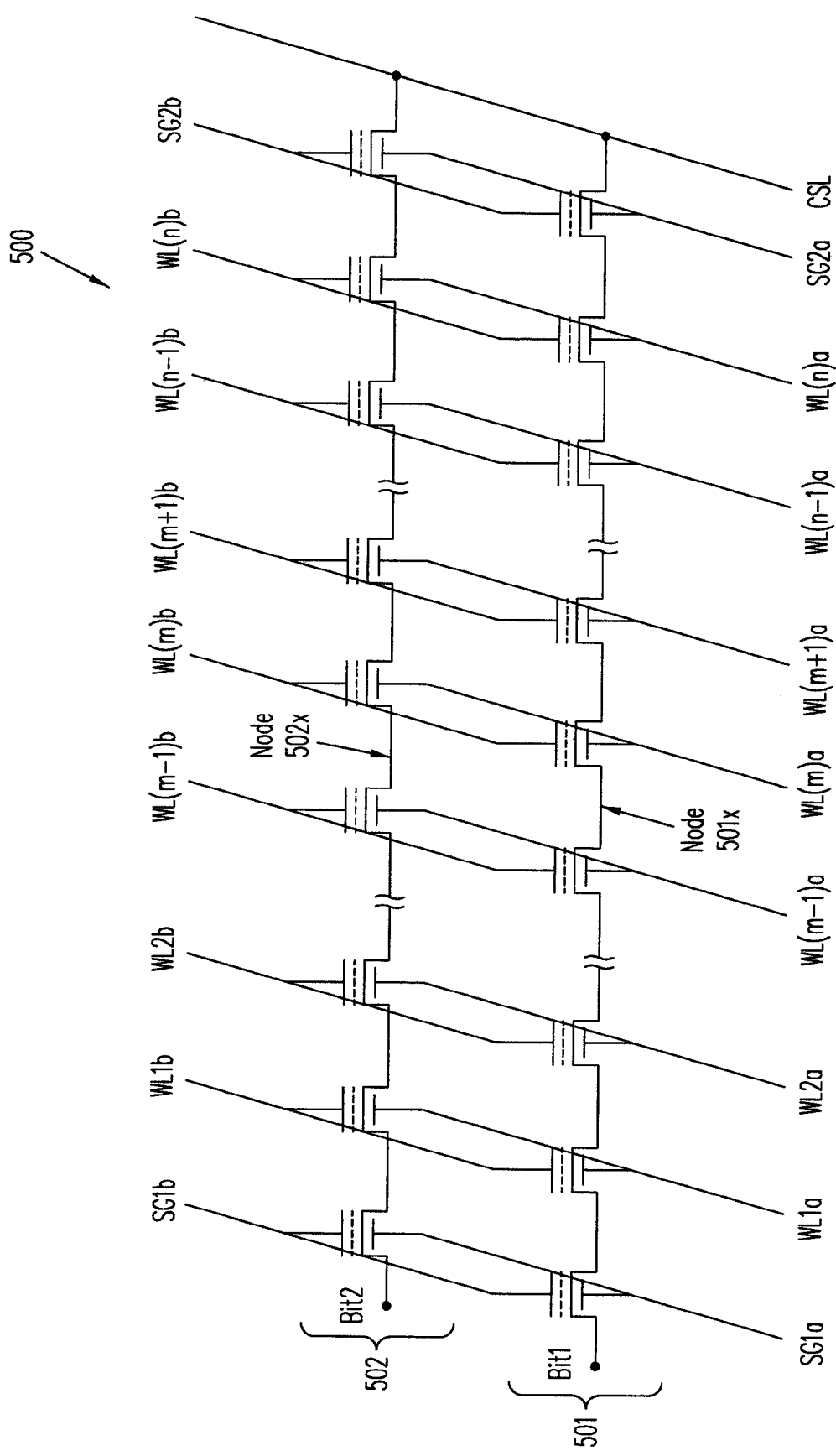
FIG. 3 shows two NAND strings 501 and 502, each having serially connected dual-gate memory cells and a dual-gate select device at each end of the NAND string.

FIG. 3 shows NAND strings 501 and 502, using electric circuit symbol 200 of FIG. 2 for each dual-gate memory cell. As shown in FIG. 3, NAND strings 501 and 502 are each formed by a number of dual-gate memory cells, with corresponding dual-gate memory cells from NAND strings 501 and 502 sharing the same access gate electrode word line (i.e., word lines WLia, i=1, ... n) and memory gate electrode word line (i.e., word lines WLib, i=1, ... n). NAND strings sharing word lines may be adjacent to each other, or may be separated from each other by one or more NAND strings in between. Each NAND string may have a select dual-gate device (e.g., the device controlled by word lines SG1a and SG1b) in the NAND string between the bit line contact (i.e., Bit1 or Bit2) and the dual-gate memory cells, and a select dual-gate device (e.g., the device controlled by word lines SG2a and SG2b) between the common source contact CSL and the dual-gate memory cells. In FIG. 3, nodes 501x and 502x are labeled in NAND strings 501 and 502, respectively, to facilitate further discussion below, in conjunction with programming one or more of the dual-gate memory cells controlled by word lines WLmb and WLma.

Figure 4:
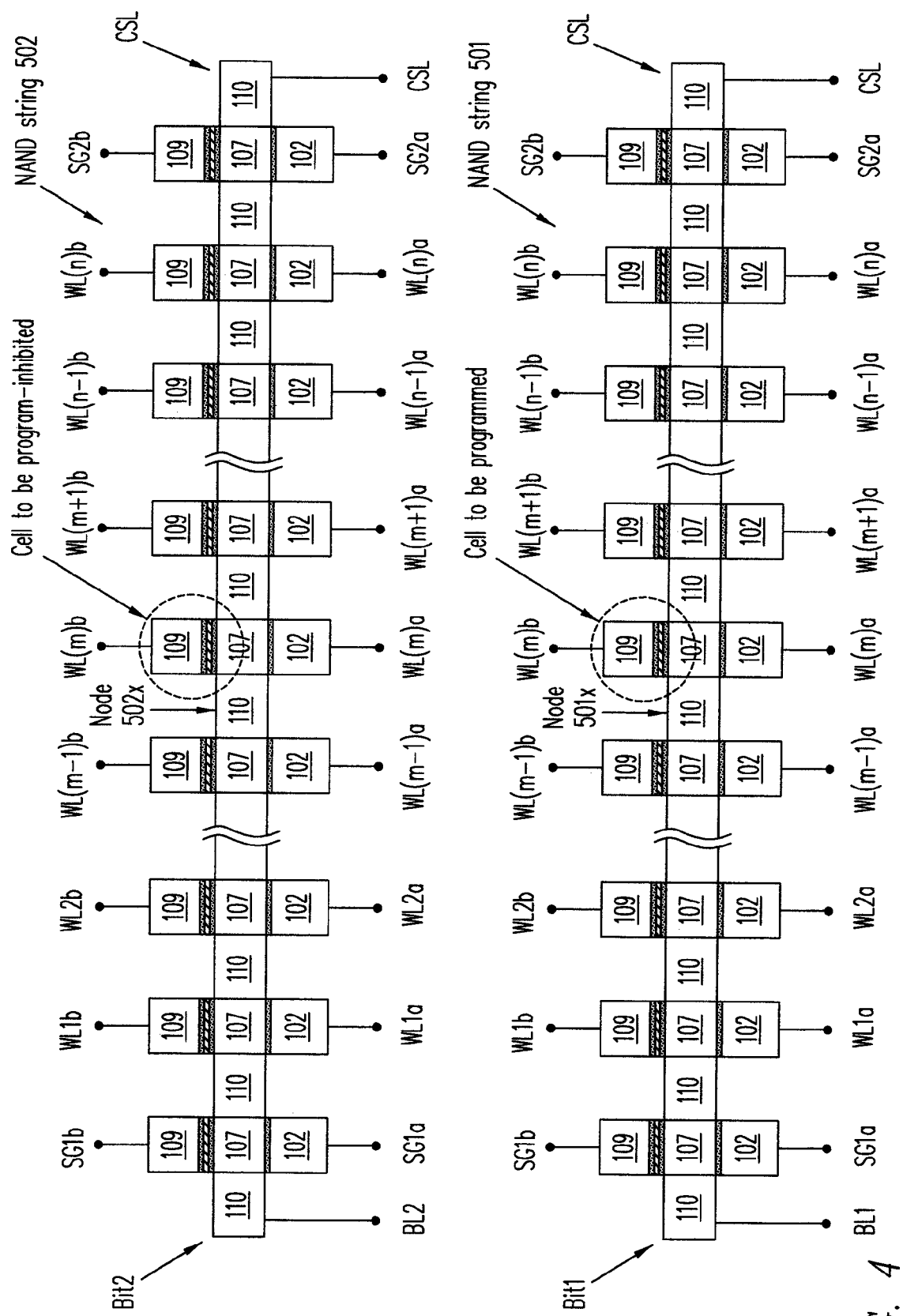
FIG. 4 shows cross sections of the dual-gate NAND strings 501 and 502, together with the signal names associated with the electrodes used for voltage application.

FIG. 4 shows cross sections of dual-gate NAND strings 501 and 502 of FIG. 3, together with the signal names associated with each electrode of the dual-gate memory cells.

Figure 7:
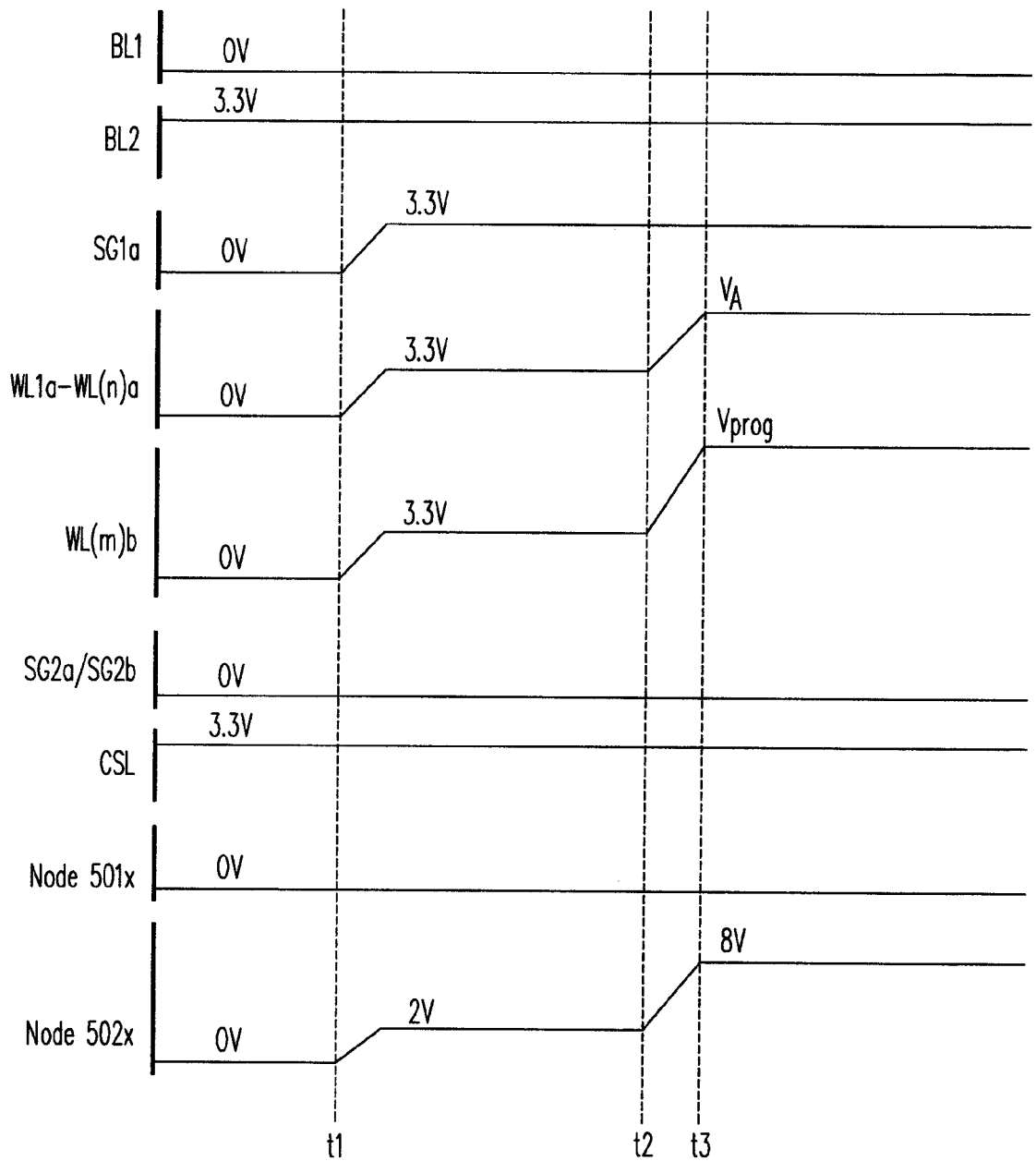
FIG. 7 shows the voltage waveforms at various nodes of dual-gate NAND strings 501 and 502, according to one embodiment of the present invention, when one memory cell is programmed.

FIG. 7 shows voltage waveforms at various nodes of dual-gate NAND strings 501 and 502, according to a first embodiment of the present invention, when the memory device of one of the dual-gate memory cells in NAND string 501 and 502 is programmed. In the example of FIG. 7, the memory device in NAND string 501 coupled to word line WLmb is selected to be programmed. That memory cell shares word line WLmb with a corresponding dual-gate memory cell in unselected NAND string 502. In this embodiment, the programming method uses a self-boosting technique. Initially, common source line CSL and bit line BL2 (bit2) are set to a first voltage $V_1$, which may be, for example, 3.3 volts (as is shown in FIG. 7). At the same time, bit line BL1 (bit1) coupled to the selected NAND string, select gate electrodes SG2a and SG2b (coupled to common source line CSL), select gate electrodes SG1a, and access gate word lines WL1a-WLna (i.e., the word lines associated with the gate electrodes all the access devices of selected NAND string 501), and word line WLmb (which is associated with the gate electrode of the memory device to be programmed in NAND string 501) are set to a second voltage $V_2$, which is shown here as ground.

At time $t_1$, the voltages at select gate electrode SG1a, access gate word lines WL1a-WLna, and word line WLmb are brought to voltage $V_1$. In this embodiment, voltage $V_1$ is above both the threshold voltage of an access device and the threshold voltage of an erased memory device. (Before programming, the memory cells are erased and left in the erased state.) By bringing the gate electrodes of the access devices to voltage $V_1$, an inversion layer is formed in each access device in both NAND strings. In addition, an inversion layer is also formed in the memory devices of the dual-gate memory cells sharing the word line WLmb.

Because the voltage on bit line BL1 is at voltage $V_2$, which is ground voltage in this first embodiment, the voltage of the inversion layer in selected NAND string 501 (i.e., node 501x) is voltage $V_2$. The voltage of corresponding node in unselected NAND string 502 (i.e., node 502x) is close to $V_1$ less an access device threshold voltage drop. Thus, in the unselected NAND string 502, the inversion layer at the access devices and the inversion layer of the memory cell associated with word line WLmb are substantially electrically floating.

Between times $t_2$ and $t_3$, the voltages on the common access gate word lines WL1a-WLna (i.e., word lines connecting the gate electrodes of the access devices in NAND strings 501 and 502) are raised to a voltage $V_A$, thereby rendering all the access devices conducting. Voltage $V_A$ is higher than voltage $V_1$ (e.g., in the range of 3.3V to 15V, typically about 9V). At the same time, the voltage on word line WLmb connecting to the gate electrode of the selected memory device is raised to voltage $V_{prog}$, which is a higher voltage than $V_A$ (e.g., in the range of 9V to 17V, typically about 14V). In unselected NAND string 502, the voltages in the inversion layers and the source-drain electrodes are capacitively boosted, as shown in FIG. 7 for node 502x. Consequently, in unselected NAND string 502, the voltage between the programming word line WLmb and the inversion channel in its associated memory device is too low to cause inadvertent programming. In this way, programming is inhibited in this unselected dual-gate memory cell of NAND string 502, while the corresponding dual-gate memory cell in NAND string 501 experiences the full voltage between the voltage on WLmb at the gate electrode of its memory device and voltage $V_2$ at its inversion layer, as shown for node 501x in FIG. 7.

The value of the voltage $V_A$ can be increased to counteract the effect of leakage current from the boosted node (i.e., Node 502x) to ground, which reduces the voltage of the boosted node.

The voltages on nodes shown in FIG. 4 that are not explicitly mentioned in the above description may be regarded as being at or close to ground voltage, or at a small voltage that practically minimizes inversion in their associated devices. These voltage levels may be optimized to reduce leakage current from the boosted node and to minimize other disturb mechanisms.

Figure 5:
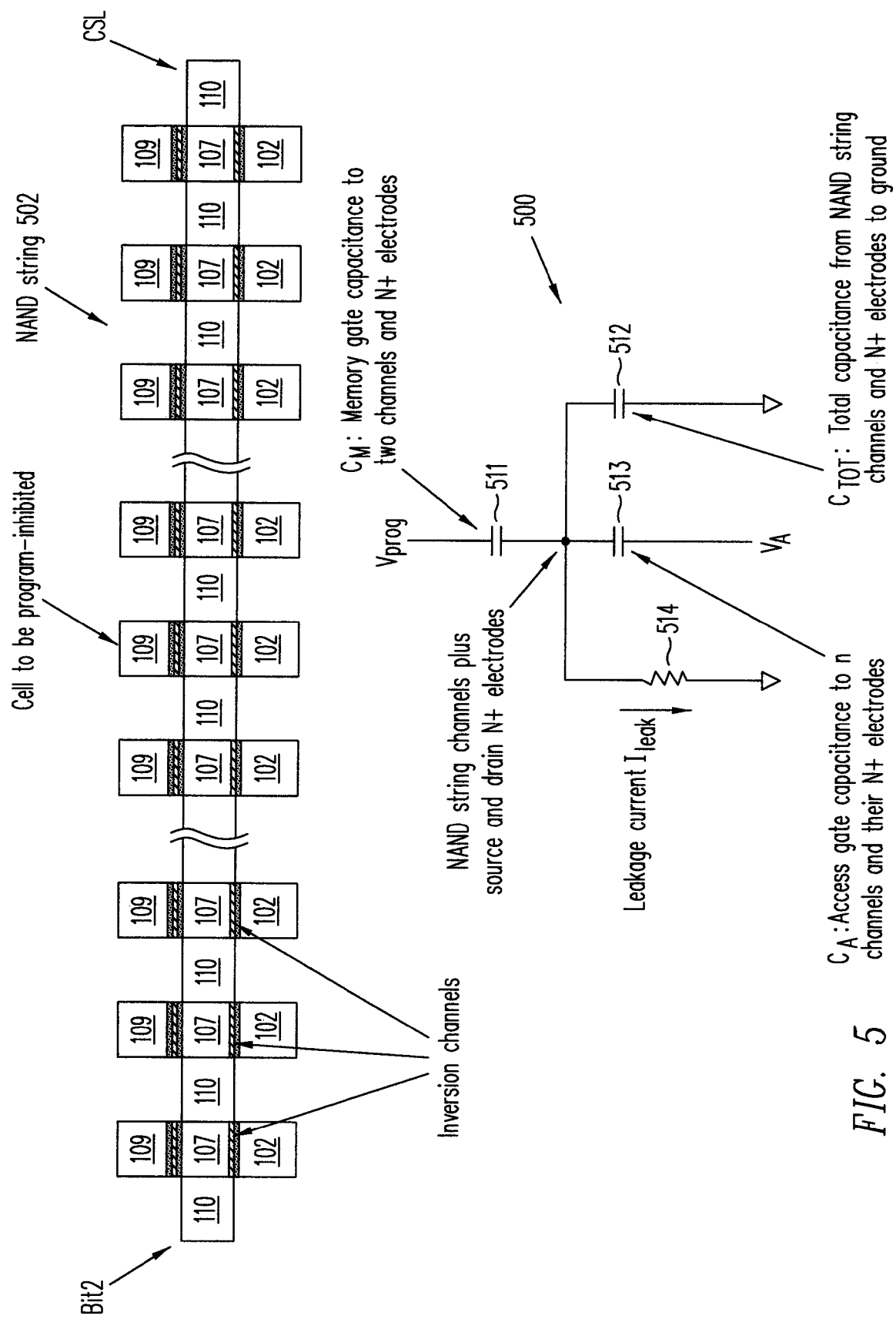
FIG. 5 shows dual-gate NAND string 502 and its associated capacitance and leakage model 510 during programming of a memory cell in NAND string 502, in accordance with a first embodiment of the present invention.

FIG. 5 shows dual-gate NAND string 502 and associated capacitance and leakage model 510 for NAND string 502 during programming of a memory cell in the NAND string 502, according to this first embodiment of the present invention. As shown in FIG. 5, to program a memory cell, all access devices in NAND string 502 are rendered conducting, by creating an inversion layer in semiconductor region 107 next to dielectric layer 106 of each access device in NAND string 502. Capacitance and leakage model 510 includes (a) capacitor 511, which represents the capacitance $C_M$ between (i) the gate electrode of the memory device in the dual-gate memory cell to be programmed and (ii) the two channels (i.e., the channels of the access device and the memory device) and the source/drain electrodes in the same dual-gate memory cell; (b) capacitor 512, which represents the total capacitance $C_{TOT}$ between (i) the channels and the source/drain electrodes in NAND string 502 and (ii) ground, (c) capacitor 513, which represents the capacitance $C_A$ between (i) the gate electrodes of the access devices in NAND string 502 and (ii) the channels and the source/drain electrodes in NAND string 502, and (d) resistor 514, whose current models the leakage current $I_{leak}$ between (i) the channels and the source/drain electrodes in NAND string 502 and (ii) ground.

Using the models of FIG. 5, the capacitive boosting of the inversion layer associated with the memory cell in unselected NAND string 502 can be expressed as follows:

$$V_{ch} = V_{chi} + \frac{C_A V_A}{C_A + C_{TOT}} + \frac{C_M V_{prog}}{C_M + C_{TOT}} - \frac{I_{leak} T_p}{C_{TOT}}$$

where $V_{ch}$ is the boosted channel voltage, $V_{chi}$ is the initial voltage transferred from the bit line via the select transistor, and $T_p$ is the program pulse width. Thus, increasing $V_A$ counteracts leakage current $I_{leak}$, and thus optimizes program inhibition without disturbing the memory devices in both the selected NAND string and the unselected NAND string. In this way, this embodiment takes advantage of the strong electrical interaction between the access devices and the memory devices in the unselected memory string to avoid program disturb.

In this first embodiment of the present invention, the dual-gate memory cells within a NAND string may be programmed in any order. This is because the access to ground for the inversion layer of the memory device being programmed is provided through the access devices in the NAND string and not through other memory devices in the NAND string, whose threshold voltage levels may vary. In this first embodiment, the voltages used have the following relationship: $V_{prog} \geq V_A \geq V_1 \geq V_2$.

Figure 8:
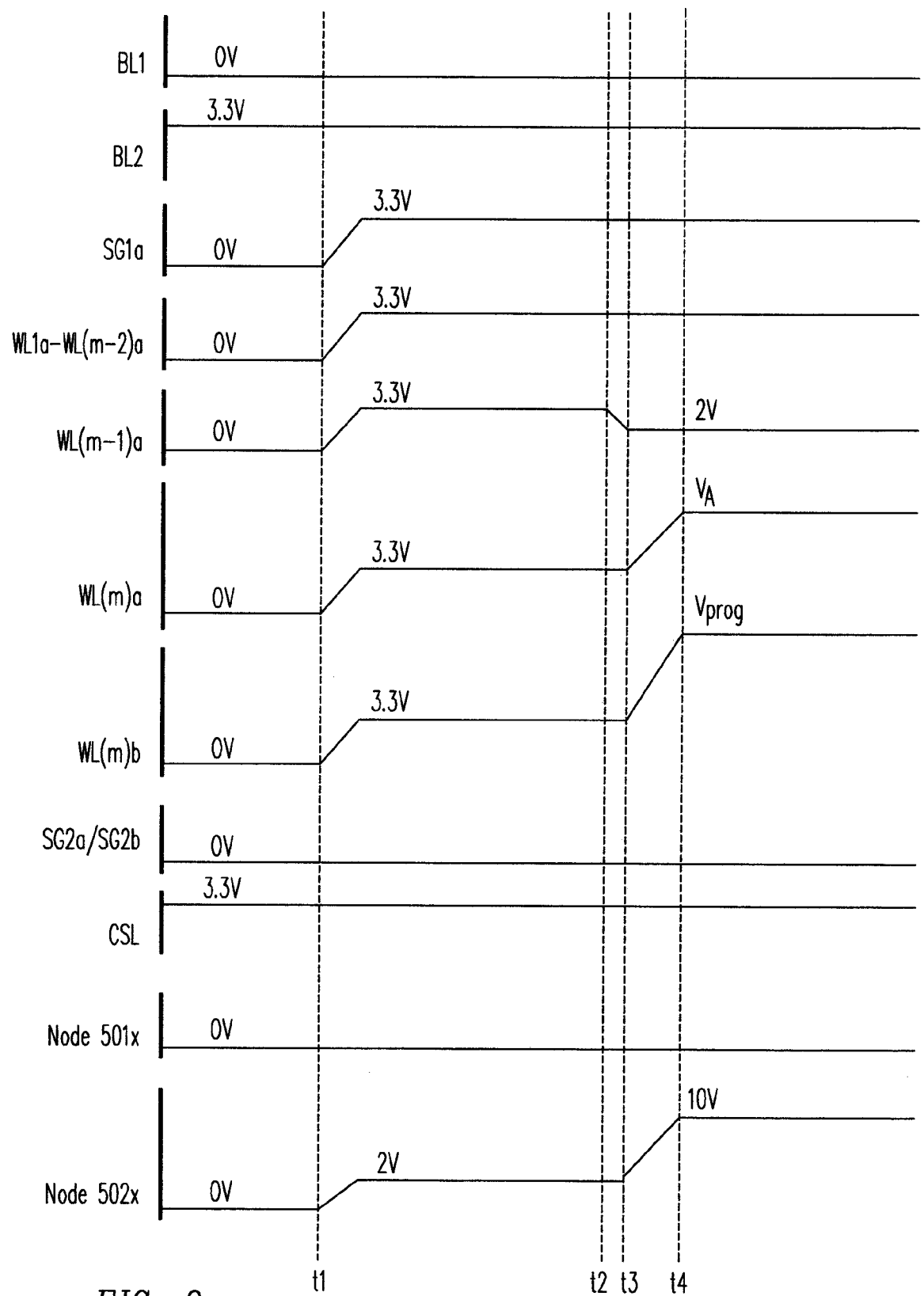
FIG. 8 shows the voltage waveforms at various nodes of two dual-gate NAND strings, according to a second embodiment of the present invention, when one memory cell is programmed.

FIG. 8 shows voltage waveforms at various nodes of dual-gate NAND strings 501 and 502, according to a second embodiment of the present invention, which uses a local self-boosting technique. Initially, common source line CSL and bit line BL2 (bit2) of unselected NAND string 502 are set to a first voltage $V_1$. In this second embodiment, voltage $V_1$ may be 3.3V. At the same time, bit line BL1 (bit1) in selected NAND string 501, source select gate electrodes SG2a and SG2b, bit line select gate electrode SG1a, and access gate word lines WL1a-WLma, and word line WLmb are each set to a second voltage $V_2$. In this second embodiment, voltage $V_2$ may be ground.

At time $t_1$ select gate electrode SG1a and access gate word lines, WL1a-WLma, and word line WLmb are each brought to voltage $V_1$. In this second embodiment, voltage $V_1$ is above both the threshold voltage of an access gate device and the threshold voltage of an erased memory device. As in the first embodiment, the dual-gate memory cells are erased and left in the erased state prior to programming. By bringing these nodes to voltage $V_1$, an inversion layer is formed in each of the access devices associated with word lines WL1a-WLma in both NAND strings 501 and 502, and in the memory devices associated with word line WLmb. The voltage at the inversion layer in access devices associated with word lines WL1a-WLma in NAND string 501 (e.g., node 501x) is voltage $V_2$, while the voltage at corresponding inversion layers in unselected NAND string 502 (e.g., node 502x) is close to voltage $V_1$ less an access device threshold voltage drop. As in the first embodiment, in unselected NAND string 502, the inversion layers of the access devices and the inversion layer of the memory device associated with word line WLmb are substantially electrically floating. In unselected NAND string 502, inversion layers are formed in access devices between bit line contact BL2 up to and including the access device opposite the memory device to be program inhibited.

At time $t_2$, the voltage on word line WL(m−1)a is reduced to below $V_1$, at voltage $V_3$ (e.g., about 2V). Thus, in NAND string 502, the access device adjacent the access device that is opposite the memory device to be program-inhibited is rendered non-conducting, while the corresponding access device in NAND string 501 remains conducting. In this way, the dual-gate device associated with word line WLma in unselected NAND string 502 electrically floats, independently of the floating inversion layers and source/drain electrodes between it and bit line contact BL2.

At time $t_3$, word line WLma is raised to a voltage $V_A$, which is higher than voltage $V_1$ (e.g., in the range of 3.3V to 15V, typically about 9V). At the same time, the voltage of the selected memory cell word line is raised to a value $V_{prog}$ which is higher than $V_A$ (e.g., in the range of 9V to 17V, typically about 14V). The voltages in the inversion layers within this dual-gate device in unselected NAND string 502, along with the source-drain electrodes connected to these inversion layers, are capacitively boosted in voltage (e.g., to about 10 volts), as shown in FIG. 8 for node 502x. Consequently, in NAND string 502, the voltage across the programming word line WLmb and the inversion channel of the memory device is too low to cause programming. Thus, programming is inhibited in this unselected memory device, while the memory device to be programmed experiences the full voltage across its gate electrode tied to WLmb and its channel (at voltage $V_2$, which is ground voltage in this second embodiment). The value of the voltage $V_A$ can be increased to counteract the effect of the leakage current from the boosted node to ground, which reduces the voltage of the boosted node.

The voltages on nodes shown in FIG. 4 that are not explicitly mentioned in the above description may be regarded as being at or close to ground voltage, or at a small voltage that practically minimizes inversion in their associated devices. These voltage levels may be optimized to reduce leakage current from the boosted node and to minimize other disturb mechanisms.

Figure 6:
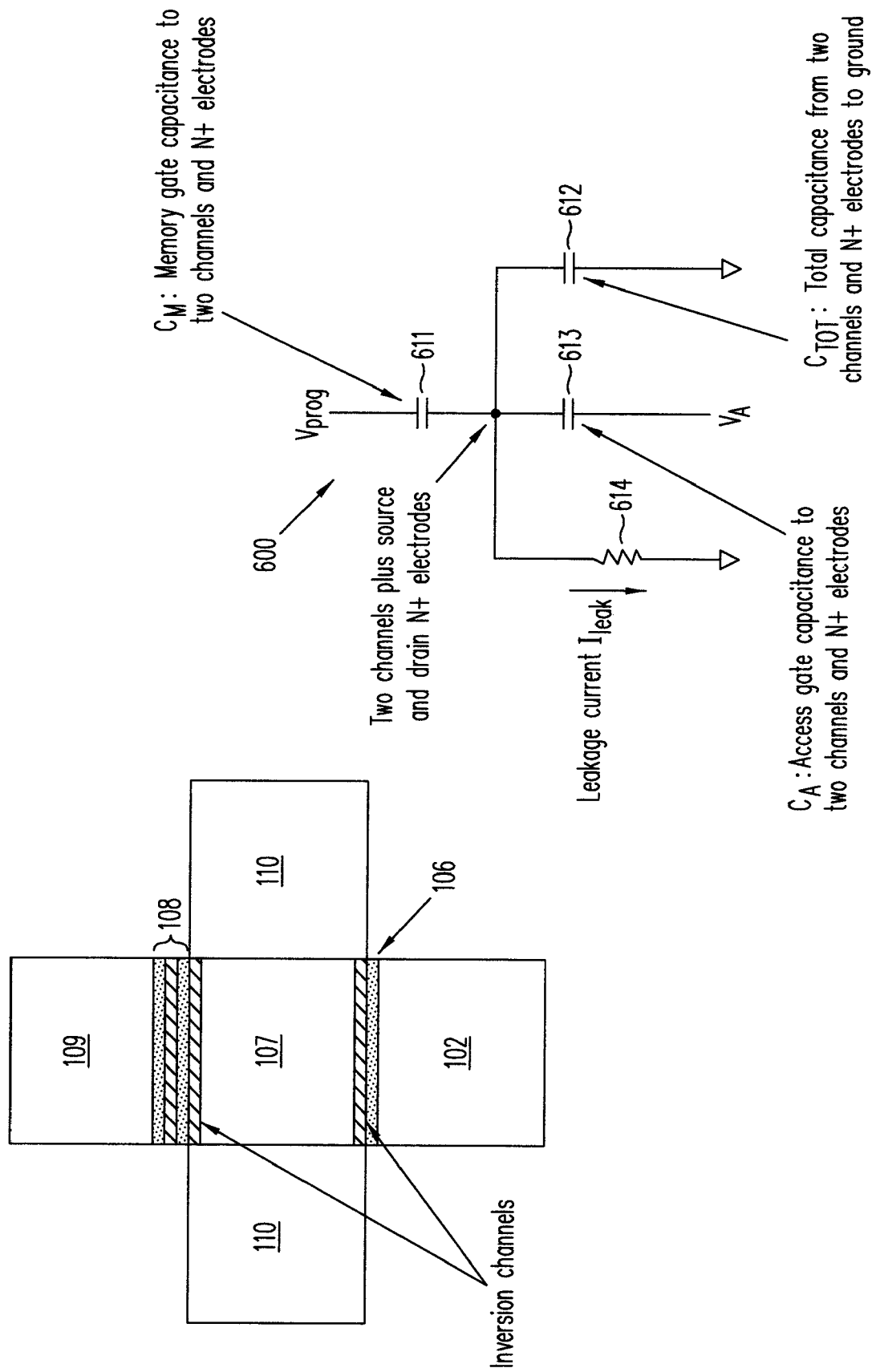
FIG. 6 shows dual-gate memory cell 600 and its associated capacitance and leakage model 610 during programming of the memory device, in accordance with a second embodiment of the present invention.

FIG. 6 shows dual-gate memory cell 600 and associated capacitance and leakage model 610 during programming of the memory device in dual gate memory cell 600, according this second embodiment of the present invention. As shown in FIG. 6, to program dual-gate memory cell 600, its access devices is rendered conducting, by creating an inversion layer in semiconductor region 107 next to its dielectric layer 106. Capacitance and leakage model 610 includes (a) capacitor 611, which represents the capacitance $C_M$ between (i) the gate electrode of the memory device of dual-gate memory cell 600 and (ii) the two channels (i.e., the channels of the access device and the memory device) and the source/drain electrodes of dual-gate memory cell 600; (b) capacitor 612, which represents the total capacitance $C_{TOT}$ between (i) the two channels and the source/drain electrodes of dual-gate memory cell 600 and (ii) ground, (c) capacitor 613, which represents the capacitance $C_A$ between (i) the gate electrodes of the access devices of dual-gate memory cell 600 and (ii) its two channels and the source/drain electrodes, and (d) resistor 614, whose current models the leakage current $I_{leak}$ between (i) the two channels and the source/drain electrodes of dual-gate memory cell 600 and (ii) ground.

Using the models of FIG. 6, the capacitive boosting of the inversion layer associated with the memory cell in unselected NAND string 502 can be expressed as follows:

$$V_{ch} = V_{chi} + \frac{C_A V_A}{C_A + C_{TOT}} + \frac{C_M V_{prog}}{C_M + C_{TOT}} - \frac{I_{leak} T_p}{C_{TOT}}$$

where $V_{ch}$ is the boosted channel voltage of the unselected dual-gate device's two inversion channels and source and drain electrodes, $V_{chi}$ is the initial voltage transferred from the bit line via the select transistor and the access devices between the select transistor and the dual-gate memory cell to be program inhibited, and $T_p$ is the program pulse width. Thus, increasing $V_A$ counteracts leakage current $I_{leak}$, and thus optimizes program inhibition without disturbing the memory devices in both the selected NAND string and the unselected NAND string. The suitable value for voltage $V_A$ may be position-dependent, as leakage current $I_{leak}$ may be a function of position. Unlike the first embodiment described above, access devices between the bit line contact and the dual-gate device being boosted have the voltages on their gate electrodes (i.e., the voltages on word lines WL1a to WL(m–1)a) kept at a reasonably low voltage.

In this second embodiment in the present invention, the voltages used have the following relationship: $V_{prog} \geq VA \geq V1 \geq V3 \geq V_2$.

Thus, this second embodiment also takes advantage of the strong electrical interaction between the access devices and the memory devices in the unselected memory string to avoid program disturb.

Figure 9:
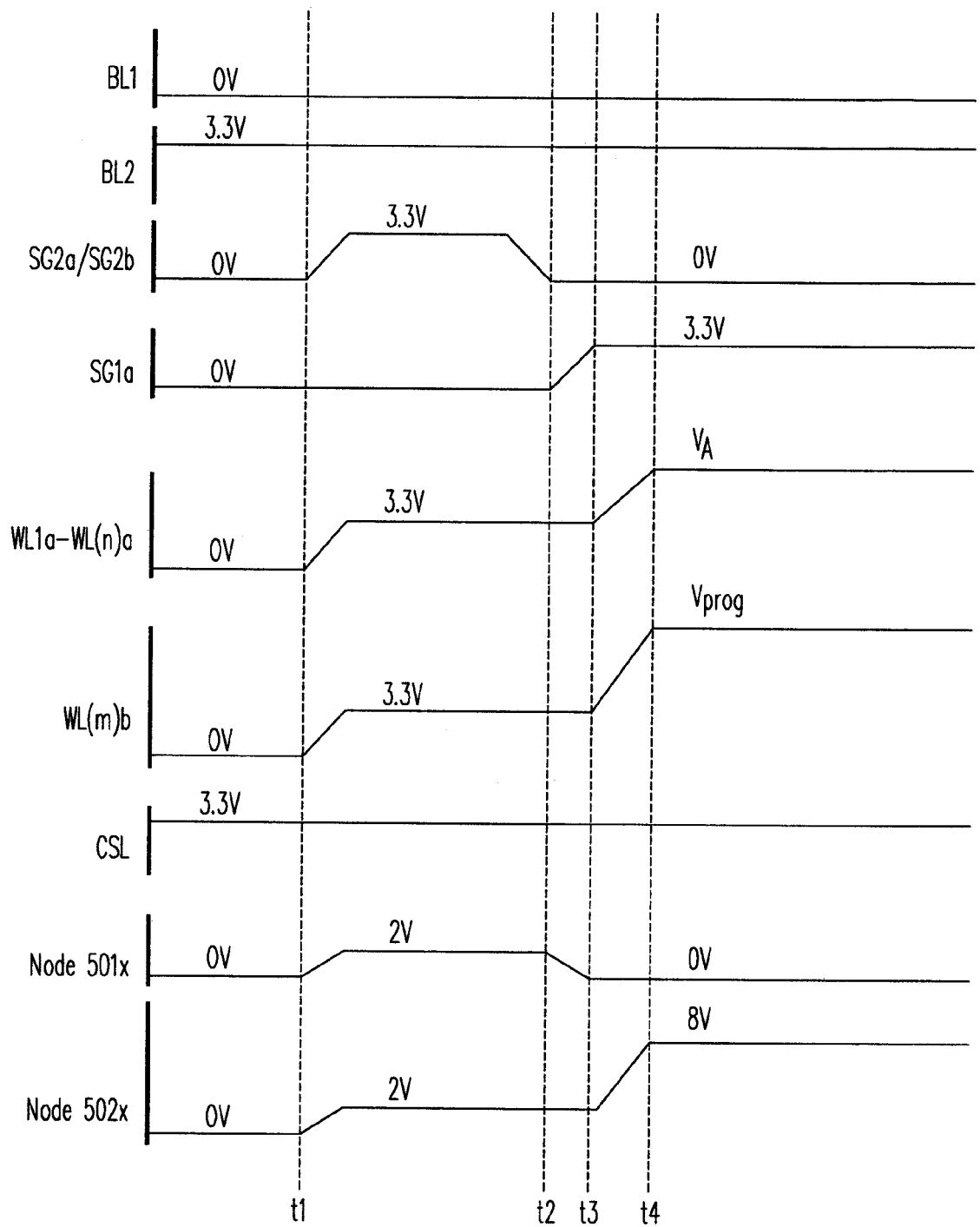
FIG. 9 shows the voltage waveforms at various nodes of two dual-gate NAND strings, according to a third embodiment of the present invention, when one memory cell is programmed.
Figure 12:
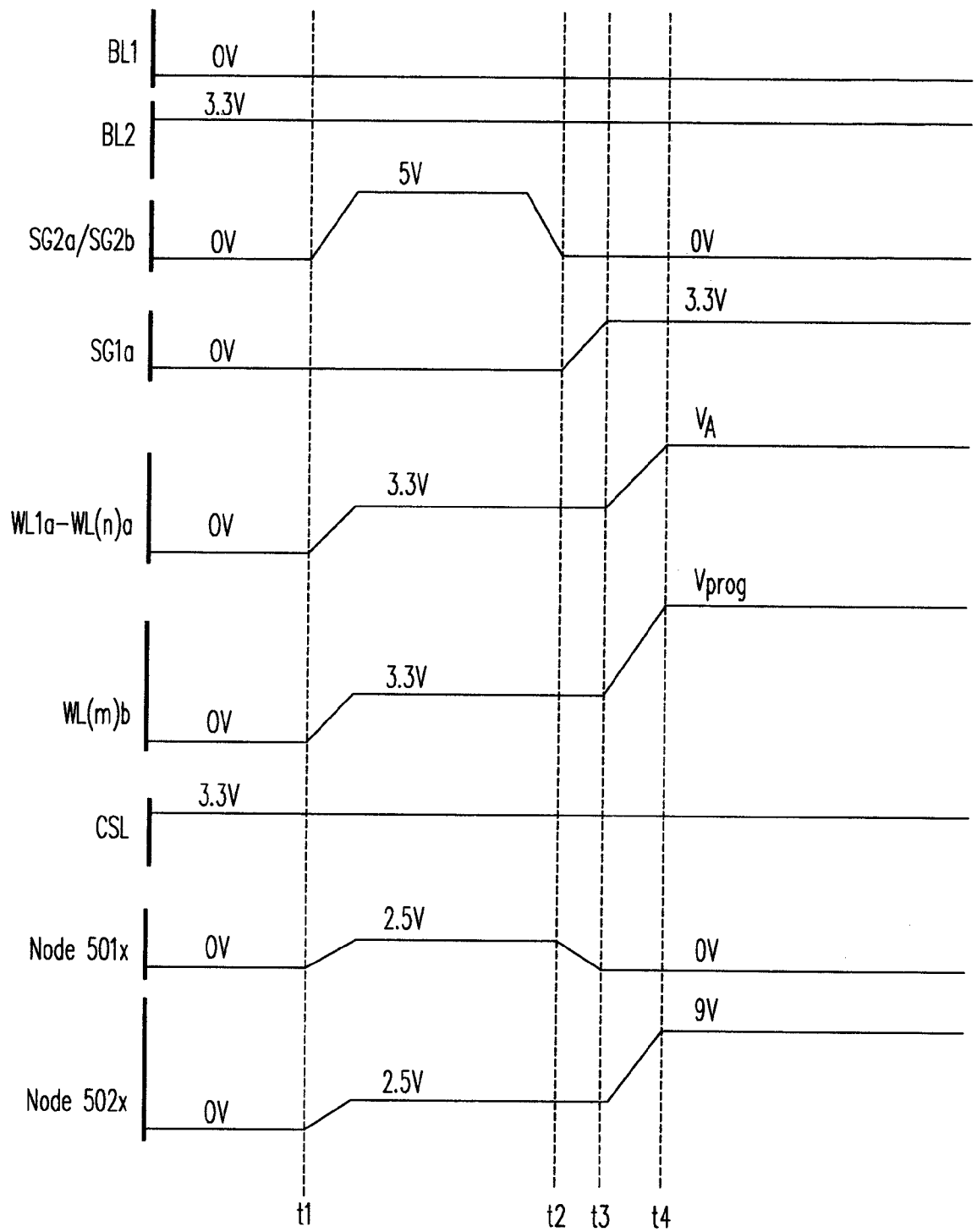
FIG. 12 shows the voltage waveforms at various nodes of two dual-gate NAND strings, according to a sixth embodiment of the present invention, when one memory cell is to programmed.

FIG. 9 shows voltage waveforms at various nodes of dual-gate NAND strings 501 and 502, according to a third embodiment of the present invention. This third embodiment uses also a self-boosting technique. This third embodiment is similar to the first embodiment already described above with respect to the voltage waveforms of FIG. 7. However, unlike the first embodiment, the initial voltage of the floating node in unselected NAND string 502 is provided from common source line CSL, rather than bit line BL2. In this third embodiment, the source select gate electrodes SG2a and SG2b, rather than bit select gate electrode SG1a, are brought to voltage $V_1$ between times $t_1$ and $t_2$, to provide the initial voltage. Bit line select gate electrode is brought to voltage $V_1$ at time $t_2$ to bring node 501x to voltage $V_2$. Otherwise, the description provided above for the first embodiment is applicable to this third embodiment. FIG. 12 shows the voltage waveforms in a variation of this third embodiment. In FIG. 12, the voltage applied to common source select gates SG2a and SG2b is a higher voltage than $V_1$ (e.g., 5 volts, rather 3.3 volts), so that the initial voltages at nodes 501x and 502x are both at higher voltage (e.g, about 2.5 volts), without the threshold voltage drops in the access gates.

Figure 10:
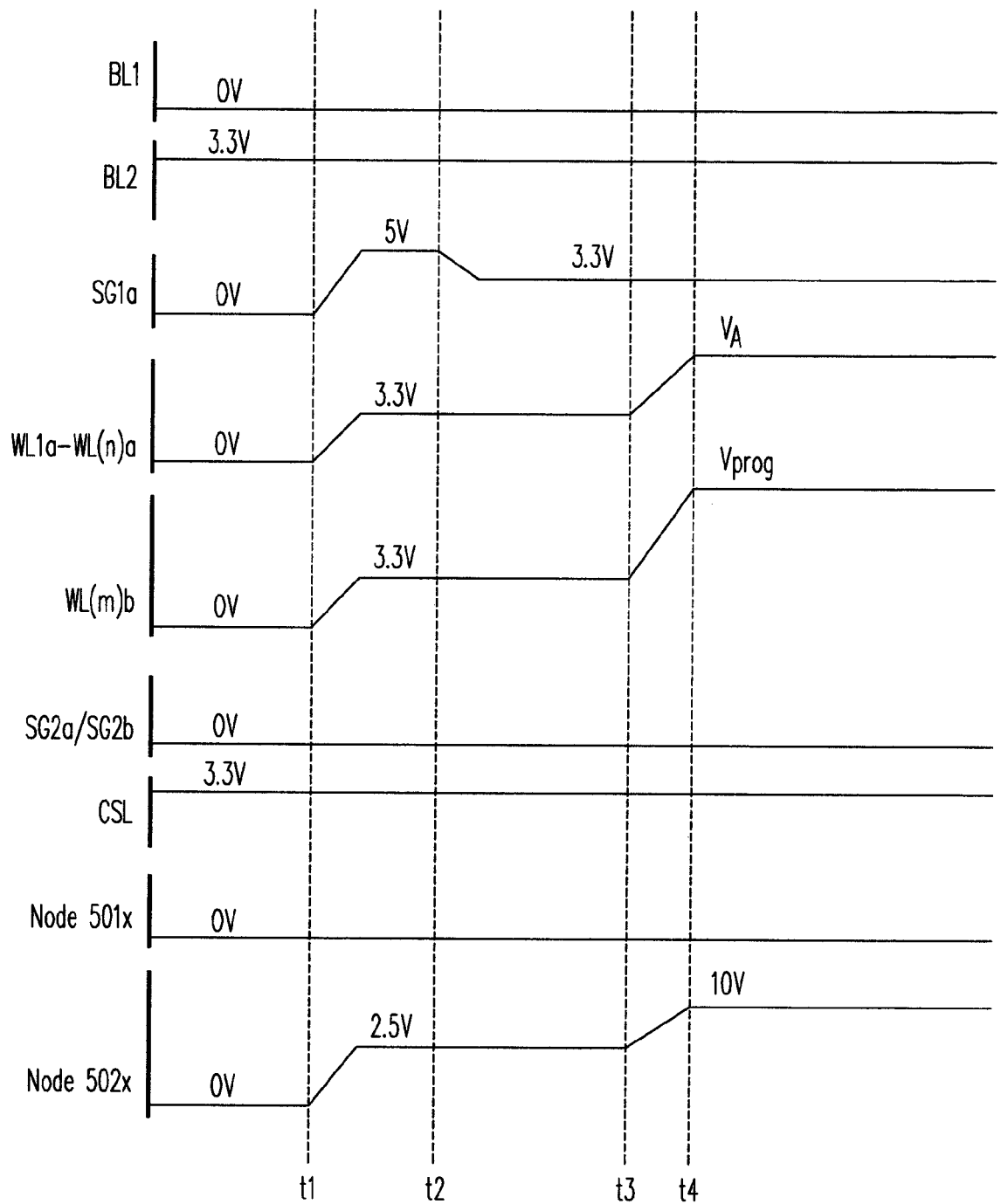
FIG. 10 shows the voltage waveforms at various nodes of two dual-gate NAND strings, according to a fourth embodiment of the present invention, when one memory cell is programmed.

FIG. 10 shows voltage waveforms at various nodes of dual-gate NAND strings 501 and 502 in a fourth embodiment of the present invention, which is a variation of the first embodiment. Unlike in the first embodiment, in this fourth embodiment, the voltage applied to bit select gate electrode SG1a is initially higher than voltage $V_1$ (e.g., 5 volts) between times $t_1$ and $t_2$, so that the initial voltage at floating node 502x reaches a higher voltage (e.g., 2.5 volts), without the threshold voltage drops in the access gates. The voltage applied to the bit select gate electrode SG1a is then reduced to $V_1$.

Figure 11:
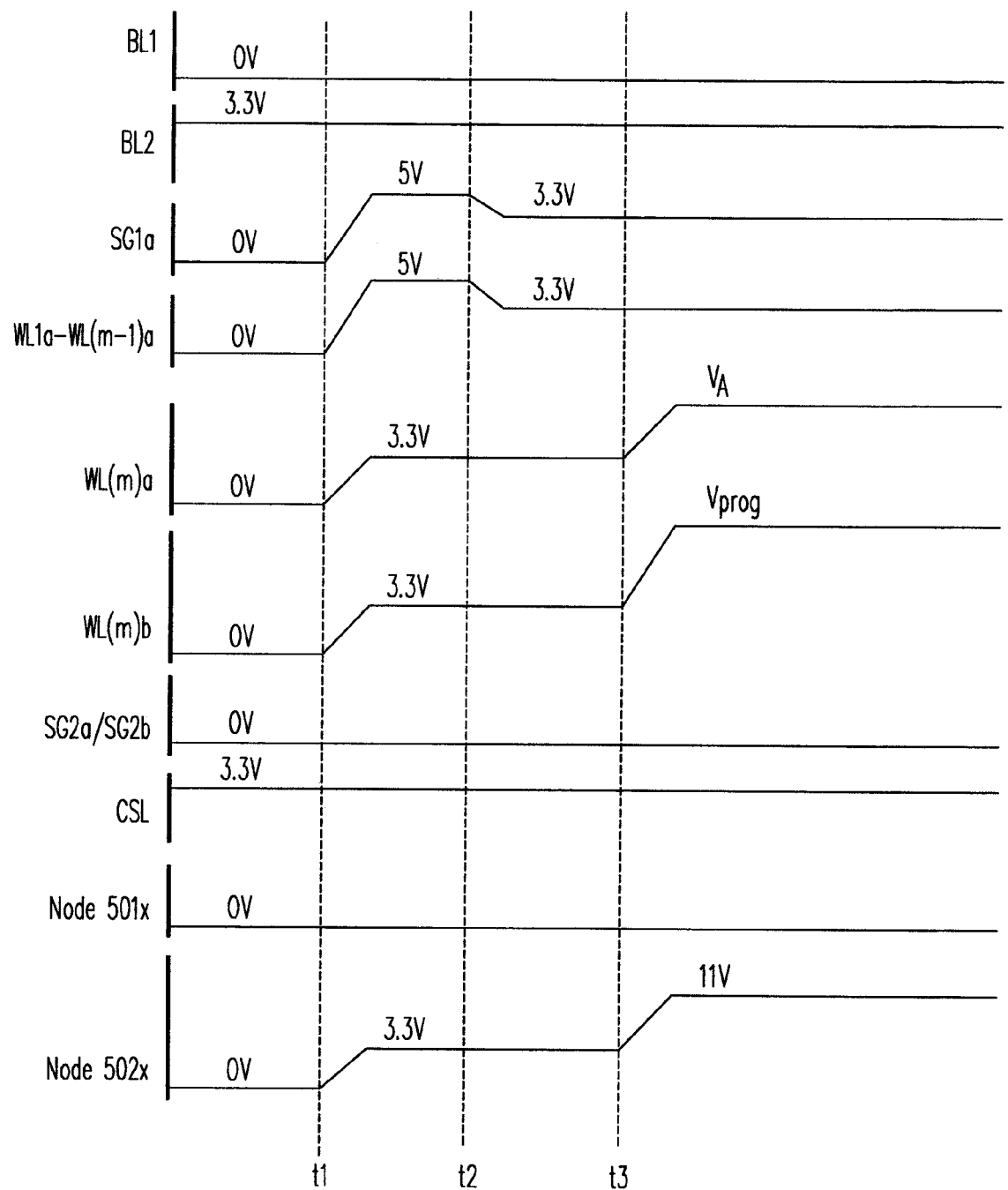
FIG. 11 shows the voltage waveforms at various nodes of two dual-gate NAND strings, according to a fifth embodiment of the present invention, when one memory cell is programmed.

FIG. 11 shows voltage waveforms in various nodes of dual-gate NAND strings 501 and 502, according to a fifth embodiment of the present invention, which is a variation of the second embodiment described above in conjunction with FIG. 8. In this fifth embodiment, the voltages at bit select gate electrode SG1a and at the gate access devices are overdriven to a higher voltage (e.g., 5 volts) between times $t_1$ and $t_2$, so that the voltage at floating node 502x reaches a higher voltage (e.g., 2.5 volts) without threshold voltage drops.

The above detailed description is provided to illustrate the specific embodiments of the present invention and is not intended to be limiting. Numerous variations and variations within the scope of the present invention are possible. The present invention is set forth in the following claims.

I claim:

1. A memory circuit, comprising:
   first and second strings of serially connected dual-gate memory cells, wherein each dual-gate memory cell comprises a memory device and an access device sharing a common channel region between a source region and a drain region;
   a first word line connecting a gate electrode of a memory device in each of the first and second strings; and a second word line connecting a gate electrode of an access device in each of the first and second strings;

wherein, during programming of the memory device of the first string:

(1) the second word line is first brought to a first predetermined voltage, while (a) the source and drain regions of the access device connected to the second word line in the first string are configured to be brought to a second predetermined voltage less than the first predetermined voltage; and (b) the source and drain regions of the access device in the second string connected to the second word line is configured to be brought to within a predetermined value of the first predetermined voltage; and thereafter, (2) the second word line is configured to be brought to a third predetermined voltage greater than the first predetermined voltage; and (3) the first word line is configured to be brought to a fourth voltage greater than the third predetermined voltage.

2. The memory circuit of claim 1, wherein each of the first and second strings further comprising a bit line and common source line located at opposite ends of the string.

3. The memory circuit of claim 2, wherein the bit line and the common source line in the second string are each configured to receive the first predetermined voltage, which is transmitted to the source and drain regions of the access device in the second string connected to the second word line.

4. The memory circuit of claim 3, wherein the bit line acts as the voltage source for transmitting the first predetermined voltage to the source and drain regions of the access device in the second string connected to the second word line.

5. The memory circuit of claim 4, wherein the first predetermined voltage is transmitted by applying the first predetermined voltage to gate electrodes of all gate electrodes of the access devices between the voltage source and the source and drain regions of the access device in the second string connected to the second word line.

6. The memory circuit of claim 3, wherein the common source line acts as the voltage source for transmitting the first predetermined voltage to the source and drain regions of the access device in the second string connected to the second word line.

7. The memory circuit of claim 6, wherein the first predetermined voltage is transmitted by applying the first predetermined voltage to gate electrodes of all gate electrodes of the access devices between the voltage source and the source and drain regions of the access device in the second string connected to the second word line.

8. The memory circuit of claim 3, wherein the first predetermined voltage is transmitted by applying the first predetermined voltage to gate electrodes of all gate electrodes of the access devices of the second string.

9. The memory circuit of claim 3, further comprising one or more select gates provided between the common source line and the access gates in the second string and between the bit line and the access gates in the second string.

10. The memory circuit of claim 9, wherein one of the select gates is provided a voltage substantially equal to the first predetermined voltage when the first predetermined voltage is transmitted to the source and drain regions of the access device in the second string connected to the second word line.

11. The memory circuit of claim 10, wherein one of the select gates is provided a voltage substantially higher than the first predetermined voltage when the first predetermined voltage is transmitted to the source and drain regions of the access device in the second string connected to the second word line.

12. A method for preventing program disturb in a memory circuit, wherein the memory circuit comprises:

first and second strings of serially connected dual-gate memory cells, wherein each dual-gate memory cell comprises a memory device and an access device sharing a common channel region between a source region and a drain region;

a first word line connecting a gate electrode of a memory device in each of the first and second strings; and a second word line connecting a gate electrode of an access device in each of the first and second strings;

the method comprising:

during programming of the memory device of the first string:

(1) bringing the second word line to a first predetermined voltage, while (a) bringing to a second predetermined voltage less than the first predetermined voltage the source and drain regions of the access device connected to the second word line in the first string; and (b) bringing to within a predetermined value of the first predetermined voltage the source and drain regions of the access device in the second string connected to the second word line is configured to be brought; and thereafter, (2) bringing the second word line to a third predetermined voltage greater than the first predetermined voltage; and (3) bringing the first word line to a fourth voltage greater than the third predetermined voltage.

13. The method of claim 12, wherein each of the first and second strings further comprising a bit line and common source line located at opposite ends of the string.

14. The method of claim 13, wherein the bit line and the common source line in the second string are each configured to receive the first predetermined voltage, which is transmitted to the source and drain regions of the access device in the second string connected to the second word line.

15. The method of claim 14, wherein the bit line acts as the voltage source for transmitting the first predetermined voltage to the source and drain regions of the access device in the second string connected to the second word line.

16. The method of claim 15, further comprising transmitting the first predetermined voltage by applying the first predetermined voltage to gate electrodes of all gate electrodes of the access devices between the voltage source and the source and drain regions of the access device in the second string connected to the second word line.

17. The method of claim 14, wherein the common source line acts as the voltage source for transmitting the first predetermined voltage to the source and drain regions of the access device in the second string connected to the second word line.

18. The method of claim 17, further comprising transmitting the first predetermined voltage by applying the first predetermined voltage to gate electrodes of all gate electrodes of the access devices between the voltage source and the source and drain regions of the access device in the second string connected to the second word line.

19. The method of claim 14, further comprising transmitting the first predetermined voltage by applying the first predetermined voltage to gate electrodes of all gate electrodes of the access devices of the second string.

20. The method of claim 14, wherein one or more select gates are provided between the common source line and the access gates in the second string and between the bit line and the access gates in the second string.

21. The method of claim 20, further comprising applying to one of the select gates a voltage substantially equal to the first predetermined voltage when the first predetermined voltage is transmitted to the source and drain regions of the access device in the second string connected to the second word line.

22. The method of claim 21, further comprising applying to one of the select gates a voltage substantially higher than the first predetermined voltage when the first predetermined voltage is transmitted to the source and drain regions of the access device in the second string connected to the second word line.

* * * * *